United States Patent [19]

Brauers et al.

[11] Patent Number: 5,729,021
[45] Date of Patent: Mar. 17, 1998

[54] X-RAY IMAGE SENSOR

[75] Inventors: Andreas Brauers; Ulrich Schiebel, both of Aachen, Germany

[73] Assignee: U.S. Philips Corporation, New York, N.Y.

[21] Appl. No.: 712,031

[22] Filed: Sep. 11, 1996

[30] Foreign Application Priority Data

Sep. 12, 1995 [EP] European Pat. Off. ............ 95202471

[51] Int. Cl.[6] .................................. G01T 1/24; G01T 1/29
[52] U.S. Cl. ...................... 250/370.09; 250/580; 378/98.8
[58] Field of Search .............................. 250/370.09, 580; 378/98.8

[56] References Cited

U.S. PATENT DOCUMENTS

| | | |
|---|---|---|
| 4,233,514 | 11/1980 | Kingsley . |
| 5,187,369 | 2/1993 | Kingsley et al. ............... 250/370.09 X |
| 5,319,206 | 6/1994 | Lee et al. ............... 250/370.09 |
| 5,381,014 | 1/1995 | Jeromin et al. . |
| 5,396,072 | 3/1995 | Schiebel et al. ............... 250/370.09 |
| 5,498,880 | 3/1996 | Lee et al. ............... 250/370.09 X |
| 5,563,421 | 10/1996 | Lee et al. ............... 250/370.09 X |

*Primary Examiner*—Edward J. Glick
*Attorney, Agent, or Firm*—Jack D. Slobod

[57] ABSTRACT

An x-ray image sensor (1) with a lead-oxide photoconductor layer (6) positioned between collecting electrodes (3) and a common electrode (2) is provided with a passivation layer (7) which separates the lead-oxide from the metal of the common electrode to counteract degradation of the photoconductor layer due to chemical reactions between then metal of the common electrode and the lead-oxide. A bias layer (8) is provided between the common electrode (2) and the photoconductor layer (6) and a cladding layer (9) is provided between collecting electrodes (3) and the photoconductor layer (6) so as to avoid injection of charges into the photoconductor layer.

20 Claims, 3 Drawing Sheets

X-RAY IMAGE SENSOR

BACKGROUND OF THE INVENTION

1. Field of the Invention

The invention pertains to an x-ray image sensor including a common electrode a plurality of x-ray sensitive sensor elements, separate sensor elements comprising a collecting electrode and a photoconductor layer containing lead-oxide ($PbO_x$) being disposed between the common electrode and the collecting electrodes. The invention also relates to an x-ray examination apparatus comprising an x-ray source for emitting an x-ray beam to irradiate an object for forming an x-ray image, an x-ray detector to derive an electronic image signal form the x-ray image, provided with such an x-ray image sensor.

2. Description of the Related Art

Such an x-ray image sensor is known from the European patent application EP 0 588 397 which corresponds to U.S. Pat. No. 5,396,072.

The known x-ray image sensor comprises a matrix of a plurality of x-ray sensitive elements arranged in columns and rows. Each row is provided with a read-out line coupled to a low-noise amplifier. The outputs of the low-noise amplifiers are coupled to a multiplex circuit. The photoconductor layer of the known x-ray image sensor consists of amorphous selenium ($\alpha$-Se). Incident x-radiation is absorbed in the photoconductor layer and generates electron-hole pairs. Under the influence of a static electrical field which is applied across the photoconductor layer by way of the common electrode, the holes migrate to the common electrode and the electrons are collected at the collecting electrodes, or vice versa depending on the polarity of the static electric field, holes are collected at the collecting electrodes and electrons migrate to the common electrode. Each collecting electrode is part of a collecting capacitance and separate sensor elements comprise respective switching elements which couple the relevant collecting electrodes to a read-line. The switching elements, which remain opened during x-irradiation, are closed to read out the collected charges and the collected charges are supplied to the respective read-lines along which they flow to respective low-noise amplifiers which integrate the current in the respective read-lines and subsequently supply a charge signal to the multiplex circuit which converts the charge signals of respective read-lines into an electronic image signal.

In the amorphous selenium the majority of charge carriers is lost due to recombination or trapping. Consequently, a large portion of image carrying x-radiation is lost as far as the formation of the electronic image signal is concerned so that the known x-ray image sensor is not suitable for deriving an electronic image signal with a high signal-to-noise ratio from low-intensity x-radiation. Moreover, due to the trapping of charge carriers, transport of charges within the photoconductor layer to the collecting electrodes is comparatively slow so that the known x-ray image sensor is not suitable to process a sequence of x-ray image in rapid succession without causing perturbations in the corresponding electronic image signals.

The cited reference mentions that a lead-oxide photoconductor layer may be employed. However, lead-oxide is strongly susceptible to degradation which occurs due to various causes such as contamination of the surface forming injection centers and electrical currents which arise due to x-ray absorption.

SUMMARY OF THE INVENTION

An object of the invention is inter alia to provide an x-ray image sensor which has a high sensitivity for x-radiation and which allows rapid transport of charge carriers within the photoconductor layer.

This object is achieved by an x-ray image sensor according to the invention which is characterized in that a passivation layer is disposed between the photoconductor layer and the common electrode.

Lead-oxide has a high absorption power for x-rays and also has a high conversion efficiency for converting x-rays into charge carriers. Moreover, lead-oxide is a (poly) crystalline material and hence loss of charge carriers during transport through the photoconductive layer is much smaller as compared to an amorphous photoconductor layer such as $\alpha$-Se. The passivation layer avoids degradation of the lead-oxide photoconductor layer since the passivation layer separates the common electrode from the photoconductor layer.

The passivation layer avoids oxidation of the lead-oxide and thereby reduction of the, notably p-type, conductivity is counteracted.

A preferred embodiment of an x-ray image sensor according to the invention is characterized in that the passivation layer is an electrically resistive layer.

The electrically resisting passivation layer separates the photoconductor layer from the common electrode. The electrical resistance of the passivation layer is arranged so that charge carriers that are generated by absorption of x-rays in the photoconductor layer are able to pass the passivation layer. A polymer passivation layer or a lacquer passivation layer can be rather easily disposed on the photoconductor layer in the from of a large surface layer. Notably, poly-p-xylylen is preferred as a polymer for forming the passivation layer since its fabrication is well compatible with vapor deposition of the lead-oxide photoconductor layer.

A further preferred embodiment of an x-ray image sensor according to the invention is characterized in that the passivation layer is a semiconductor layer.

The semiconductor layer impedes chemical reactions of the lead-oxide photoconductor layer with the common electrode and provides a biased contact between the common electrode and the photoconductor layer. The biased contact counteracts the injection of charge carriers from the common electrode into the photoconductor layer so that a high voltage across the photoconductor layer can be maintained. Preferably the semiconductor passivation layer is an amorphous selenium semiconductor layer which has a high dark resistance. In order to counteract recrystallisation of the amorphous selenium preferably the selenium is doped with 0.1% to 5% arsenic. Moreover, suitable doping of selenium strongly reduces the conductivity of the passivation layer for one type (n or p) of charge carriers. A passivation layer may also be formed from other semiconductor materials of which the n- and p-type conductivities are regulated by suitable doping or by including defects. The semiconductor passivation layer as well as the electrically resistive passivation layer can be vapor deposited, have a sufficiently high electrical resistivity and form layers which cut off the lead-oxide photoconductor layer from air.

A further preferred embodiment of an x-ray image sensor according to the invention is characterized in that a bias layer is provided between the common electrode and the photoconductor layer.

In order to maintain a sufficiently high bias voltage across the photoconductive layer, injection of carriers from the common electrode and the collecting electrode, which act as a cathode and an anode, are counteracted by disposing a suitably doped p-type conducting bias layer at the face of the photoconductor layer adjacent the cathode and a suitably doped n-type bias layer at the face of the photoconductor layer adjacent the anode. To avoid degradation of the bias properties, notably of the p-type bias layer, the passivation layer separates the photoconductor layer from the common electrode and passivates the photoconductor layer in the region near the common electrode. The bias layer provides a bias contact between the photoconductor layer and the common electrode so that injection of charge carriers from the common electrode into the photoconductor layer is counteracted so that a high voltage across the photoconductor layer is maintained. The bias layer may be disposed either between the common electrode and the passivation layer or between the photoconductor layer and the passivation layer. Moreover, the passivation layer and the bias layer may be formed as one single layer, e.g. a Cl doped Se layer. The bias layer consists of suitably doped semiconductor material. For example Cl-doped α-Se has a low mobility for electrons whereas Na-doped α-Se has a low mobility for holes. The bias layer may be uniformly doped but it is also possible to form a bias layer of which only a portion is doped.

A further preferred embodiment of an x-ray image sensor according to the invention is characterized in that the bias layer is a doped lead-oxide surface layer of the photoconductor layer. A doped lead-oxide surface layer forms a bias layer which is easily manufactured. Such a surface layer may be formed directly following the deposition of the photoconductor layer by indiffusion of the dopant material. A lead-oxide layer having p-type conductivity is formed by providing an excess of oxygen, whereas n-type conductivity is obtained by providing an excess of lead.

A further preferred embodiment of an x-ray image sensor according to the invention is characterized in that a cladding layer is disposed between the collecting electrodes and the photoconductor layer.

The cladding layer has a substantial resistivity for one type of charge carriers so that it acts as a bias contact between the collecting electrodes and the photoconductor layer. Notably the conduction type of the cladding layer is of the opposite type as compared to the bias layer which is disposed between the common electrode and the photoconductor layer. The cladding layer counteracts injection of charges from the collecting electrodes into the photoconductor layer.

A further preferred embodiment of an x-ray image sensor according to the invention is characterized in that the cladding layer is a non-stoichiometric lead-oxide layer.

When lead-oxide is used for the cladding layer, a smooth transition from the cladding layer to the photoconductor layer is obtained.

A further preferred embodiment of an x-ray image sensor according to the invention is characterized in that a resistive layer is provided between the cladding layer and the collecting electrodes.

The resistive layer is formed from a material with a high specific resistivity and functions to form space charges in regions of the photoconductor layer adjacent to portions that are located next to respective collecting electrodes. In particular, the resistivity for charges with the polarity that are collected at the collecting electrodes should be high so as to cause space charges to build-up. These space charges cause a deviation of the electrical fields in the photoconductor layer which directs any photocharges to a respective collecting electrode in case said photocharges are generated next to a respective collecting electrode. Consequently, the resistive layer reduces loss of photocharges for the formation of the electronic image signal. Intrinsic selenium or lead-oxide of substantially stoichiometric composition are suitable choices for the resistive layer.

A further preferred embodiment of an x-ray image sensor according to the invention is characterized in that the composition of the lead-oxide photoconductor layer is substantially stoichiometric. The stoichiometric lead-oxide photoconductor layer allows rapid charge transport to the collecting electrodes without substantial loss.

An x-ray examination apparatus according to the invention preferably is provided with an x-ray image sensor as previously described. The x-ray examination apparatus is able to produce a rapid succession of x-ray images without perturbations. Moreover, such an x-ray examination does not require a bulky x-ray image intensifier comprising an electronoptical imaging system with a high voltage supply. Furthermore, the operation of the x-ray examination apparatus with an x-ray image sensor is substantially insensitive to magnetic fields and therefore the x-ray examination apparatus is suitable to be operated in an environment where there are significant magnetic fields, such as in conjunction with a magnetic resonance image (MRI) apparatus.

These and other aspects of the invention will be elucidated by way of example with respect to the embodiments described hereinafter and with respect to the accompanying drawing. The drawing includes the following figures, wherein:

DETAILED DESCRIPTION OF THE PREFERRED EMBODIMENTS

Figure 1:
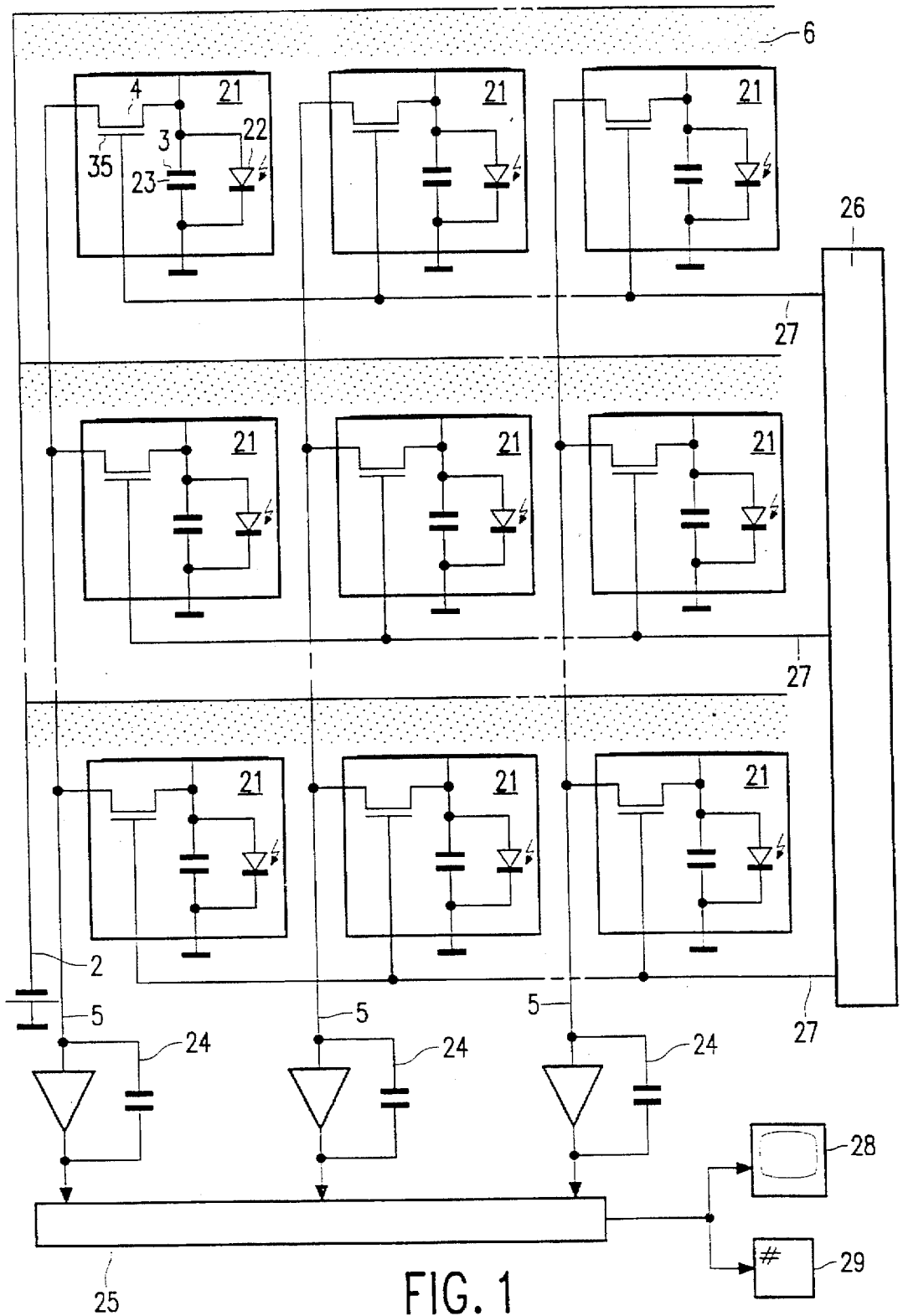
FIG. 1 shows a circuit diagram of an x-ray image sensor matrix according to the invention.

FIG. 1 shows a circuit diagram of an x-ray image sensor according to the invention. For each pixel there is provided an x-ray sensitive sensor 21 which comprises a photosensor 22, a collecting capacitance 23 and a switching element 4. Incident x-rays are converted into charges by the photosensor 22, which charges are collected by the collection capacitance 23. The collecting electrodes 3 form part of respective collecting capacitances 23. The x-ray sensitive elements are arranged in a matrix. For each column of x-ray sensitive sensors there are provided read-lines 5 and each collecting capacitance 23 is coupled to its respective read-line 5 by way of its switching element 4. Although as an example FIG. 1 shows only 3×3 x-ray sensitive elements, in a practical embodiment a much larger number of x-ray sensitive elements say 2000×2000, is employed. The photosensors are formed as a continuous lead-oxide photoconductor layer between the collecting electrodes 3 and the common electrode 2 and covering the entire image area. Incident x-rays are absorbed in the photoconductor layer 6 and electron-hole pairs are generated in the photoconductor layer. Under the influence of an electric field, having a field strength for instance in the range of $1V/\mu m$ to $20V/\mu m$, which is applied across the photoconductor layer by means of the collecting electrodes and the common electrode which function as cathode and anode. The electrons move to the anode and the holes move to the cathode. Hence, charges are collected at the collecting electrodes as a consequence of absorption of x-rays. The common electrode is for example an thin metal layer having a thickness in the range of 100 nm to 1 μm, and preferably in the range between 100 nm and 200 nm. A metal layer having a thickness in this preferred range combines good adhesion to the layer onto which it is disposed and is comparatively dense so as to have a relatively low electrical resistance. Moreover, such layers remain cheap, even if an expensive metal is used, since a relatively small amount of material is required. Suitable metals for constituting the common electrodes are for example Au, Al, Ag, Pt, Pd etc. and also indium-tin oxide ($In_ySn_{1-y}O_x(0<x<2, 0<y<1)$) is a suitable conductor for forming the common electrode.

In order to read-out the collected charges the relevant switching elements 4 are closed so as to pass charges down respective read-lines. Separate read-lines 5 are coupled to respective highly sensitive output amplifiers 24 of which the output signals are supplied to a multiplex circuit 25. The electronic image signal is composed from the output signals by the multiplex circuit 25. The switching elements 4 are controlled by means of a row-driver circuit 26 which is coupled to the switching elements for each row by means of addressing lines 27. The switching elements 4 are preferably formed as thin-film transistors (TFT) of which the drain contact is connected to a relevant read-line, the source contact is connected to the relevant collecting electrode and the gate contact is coupled to the relevant addressing line. The multiplex circuit supplies the electronic image signal e.g. to a monitor 28 on which the image information of the x-ray image is then displayed or the electronic image signal may be supplied to an image processor 29 for further processing.

Figure 2:
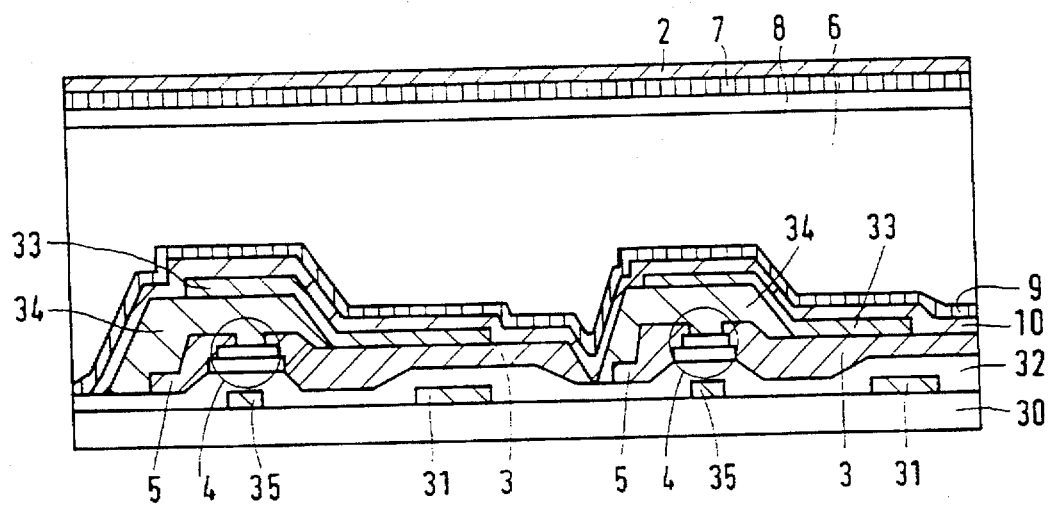
FIG. 2 shows a thin-film structure of such an x-ray image sensor in cross-sectional view.

FIG. 2 shows a thin-film structure of an x-ray image sensor according to the invention in cross-sectional view. On a substrate 30, e.g. a glass layer there is disposed a metal, e.g. aluminium, patterning comprising the addressing lines and counter-electrodes 31. A dielectric separating layer 32 covers said metal patterning. The collecting electrodes 3 together with the counter-electrodes 31 form the collecting capacitances 23. On the dielectric separating layer 32 there are disposed the collecting electrodes 3 that are located substantially above the respective counter electrodes 31 and extend to the thin-film transistor 4. In the embodiment of FIG. 2, the thin-film transistor 4 is in fact a field effect transistor consisting of a multilayer structure of differently doped semiconductor layers so that a channel is formed from the collecting electrode to the read-line. The conductivity of the channel is influenced by the voltage at the gate-contact 35 which is coupled to a respective addressing line. To achieve adequate conductivity the read-lines 5 have a width of 10 μm to 25 μm. The collecting electrode 3 is optionally provided with an electrode-extension 33 in the form of a metal layer disposed on the collecting electrode and which is separated from the thin-film transistor by a insulating layer 34. The electrode-extensions serve to increase the effective area of the collecting electrode for collecting electric changes. The collecting electrode 3 and the electrode extensions 33 are for example formed as thin metal, gold or aluminium, layers having a thickness in the range from 0.2 μm to 1 μm. In order to avoid that parasitic capacitances may disturb the reading-out of collected charges, the insulating layer 34 should have a thickness of at least 3 μm, preferably, the thickness is in the range between 5 μm and 10 μm.

The photoconductor layer 6 is formed as a polycrystalline lead-oxide ($PbO_x$, $0<x\leq2$) layer having a thickness of 30–500 μm, which has a high sensitivity for x-radiation and which allows rapid charge transport to the collecting electrodes 3 without substantial loss. Very good results are in this respect obtained with a lead-oxide photoconductor layer having a stoichiometric composition (PbO, i.e. x=1).

The cladding layer 9 separates the photoconductor layer from the collecting electrodes 3 and the electrode extensions 33. The cladding layer 9 provides a bias contact between the collecting electrodes and the photoconductor layer. Preferably, the cladding layer 9 is formed as a thin $PbO_x$-layer with a thickness in the range of 0.1 μm to 1 μm. In case the collecting electrodes functions as anode, i.e. when a positive voltage is supplied to the collecting electrodes an excess of oxygen (x>1), relative to the stoichiometric composition, is incorporated in the cladding layer 9. In case the collecting electrodes act as cathodes, i.e. a negative voltage is supplied to the collecting electrodes then the cladding layer 9 is composed so as to show a lack of oxygen relative to stoichiometric composition (x<1). These respective compositions achieve the desired bias contact between the collecting electrodes and the photoconductor layer so as to avoid charge injection from the collecting electrodes into the photoconductor layer. When $PbO_x$ is used for the cladding layer 9 a smooth transition from the cladding layer 9 to the photoconductor layer is obtained. As an alternative, the cladding layer 9 may be composed of a thin layer (0.1–1 μm) of a semiconductor having a bandgap in the range of 1.5 eV to 3 eV. Semiconductor materials which are suitable for the cladding layer 9 are inter alia Se, CdSe, CdTe, GaAs, InP, $PbO_xSe_{1-x}$, $PbO_xS_{1-x}$, $PbO_xTe_{1-x}$ (0<x<1). In order to obtain an adequate bias property such semiconductors should be suitably doped. The cladding layer 9 provides a bias contact between these electrodes The cladding 9 layer may also be composed to impede chemical reactions between the lead-oxide photoconductor layer 6 with the metal of the electrodes, for example, Se may be doped preferably with Cl, or with other halogens or oxygen to avoid injection of electrons or with Na or H to avoid injection of holes into the photoconductor layer. Recrystallization of the α-Se cladding layer is counteracted by doping with 0.1% to 5% As.

Optionally, a resistive layer 10 is disposed between the cladding layer 9 and the collecting electrodes 3. The resistive layer 10 is formed as a semiconductor layer having a high specific resistivity such as intrinsic Se or stoichiometric PbO. Stoichiometric PbO, like intrinsic Se has good electrical transport properties in that it has a long mean free path for charge carriers, that is it has a high mobility for charge carriers. However, as compared to doped or non-stoichiometric material the number of free charge carriers in intrinsic or stoichiometric material is extremely low. Hence, the conductivity is low, or correspondingly the resistivity is high. When from some external injection such as x-irradiation electrons and holes are produced which are transported without much perturbation. Preferably the resistive layer 10 has a thickness in the range of 0.1 μm to 20 μm. Such a resistive layer causes the build-up of space charges in the portions of the photoconductor layer above the regions between the collecting electrodes. Consequently, the electric field lines in the photoconductor layer are distorted so as to direct photocharges that are generated in said portions to a adjacent collecting electrode 3. This advantageous effect is particularly effective when the collecting electrodes are not provided with electrode extensions, so that then the spacing between adjacent collecting electrodes is comparatively large. When the resistive layer 10 is disposed between the cladding layer 9 and the collecting electrodes 3, the cladding layer is not in direct contact with the collecting electrodes, but still functions as a blocking barrier for carriers injected from the collecting electrode.

Between the common electrode 2 and the photoconductor layer 6 there is disposed the bias layer 8 to counteract injection of charges from the common electrode 2 into the photoconductor layer 6. Preferably, the bias layer 8 is disposed as a semiconductor layer having a bandgap of about 1 to 5 eV and a dark resistance of about $10^{11}$ Ω cm. For example the bias layer may consist of Se, CdSe, CdTe, GaAs, InP, $PbO_xSe_{1-x}$, $PbO_xS_{1-x}$ or $PbO_xTe_{1-x}$. The thickness of the bias layer is typically 0.1 to 10 μm which is much less than the thickness of the photoconductor layer. Preferably, an α-Se layer which has a high dark resistance, such as in the range of $10^{11}$ Ω cm to $10^{15}$ Ω cm is employed as the bias layer. Recrystallisation of the α-Se bias layer is counteracted by doping with 0.1% to 5% As.

Passivation of the lead-oxide photoconductor layer may also be achieved by disposing a passivation layer 7 between the common electrode and the photoconductor layer 6, notably between the photoconductor layer 6 and the bias layer 8 or between the photoconductor layer 6 and the common electrode 2. Such a separate passivation layer is preferably formed as an isolating layer having a high specific resistivity of about $10^{11}$ Ω cm and a thickness such that charge carriers that are generated in the photoconductor layer 6 due to x-ray absorption are able to cross the passivation layer 7 so as to reach the common electrode 2. The passivation layer 7 may be formed from an electrically isolating lacquer such as polyurethane or from electrically isolating resins. Preferably a poly-xylylen layer $((CH_2-C_6H_4-CH_2)_n)$ having a thickness between 0.1 μm and 2 μm is employed because this material can be vapor deposited from (2,2)paracyclophane in situ on the lead-oxide photoconductor layer, i.e. the poly-xylylen passivation layer can be deposited immediately after the deposition of the lead-oxide of the photoconductor layer is completed. The use of such a passivation layer has therefore the advantage that the lead-oxide photoconductor layer is already passivated when the bias layer and the common electrode are disposed.

As an alternative, the passivation layer may be formed as a surface layer of the lead-oxide photoconductor layer, notably doped with sulphur, selenium or tellurium. A surface layer of for example $PbO_xS_{1-x}$, $PbO_xSe_{1-x}$ or $PbO_xTe_{1-x}$ on the surface of the photoconductor layer 6 is a passivation layer 7 which has a low transverse electrical conductivity, that is its resistivity is at least about $10^{11}$ Ω cm. Particularly favorable results are achieved by a Cl-doped α-Se bias layer 8 which is disposed between the lead-oxide photoconductor layer 6 and a Cl-doped or intrinsic α-Se passivation layer 7. Such a combination counteracts injection of electrons from the common electrode into the photoconductor layer and avoids degradation of the photoconductor layer.

Figure 3:
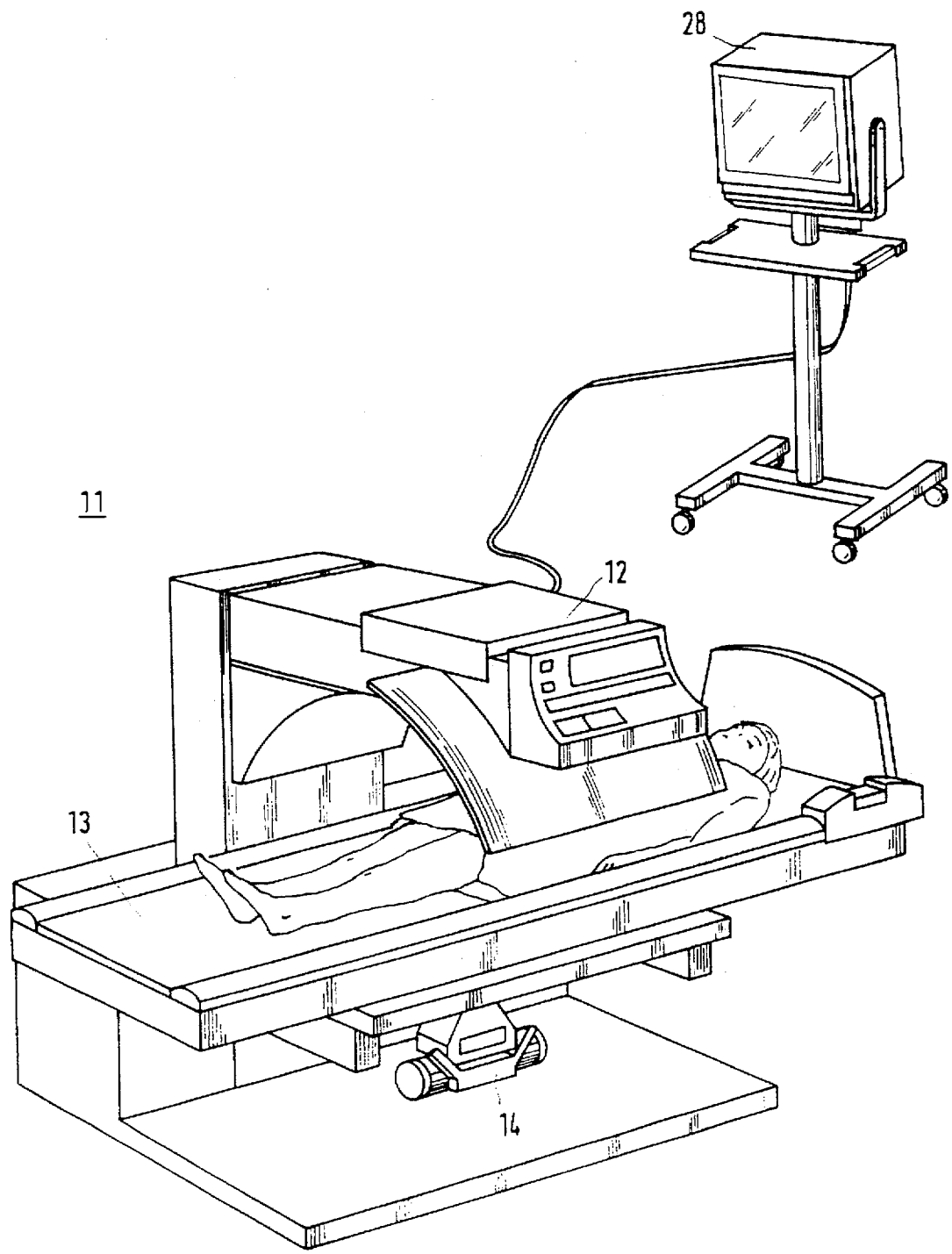
FIG. 3 shows an x-ray examination apparatus comprising an x-ray image sensor according to the invention.

FIG. 3 shows an x-ray examination apparatus comprising an x-ray image sensor according to the invention. The x-ray examination apparatus comprises a patient table 13 on which a patient who is to be examined can be positioned. An x-ray source 14 is provided under the patient table. The x-ray detector 12 is mounted on a carrier 15 so that the x-ray detector faces the x-ray source. In order to produce an x-ray image, the patient is irradiated with an x-ray beam which is emitted by the x-ray source. Owing to local differences of the x-ray absorption in the patient an x-ray shadow image is formed on the x-ray detector. By the x-ray image sensor 1 which is incorporated in the x-detector the x-ray image is converted into an electronic image signal. The electronic image signal is supplied to the monitor 28 on which the image information of the x-ray image is displayed.

We claim:

1. An x-ray image sensor (1) comprising a common electrode (2), a plurality of x-ray sensitive sensor elements each comprising a collecting electrode (3), and a photoconductor layer (6) containing lead-oxide ($PbO_x$) being disposed between the common electrode (2) and the collecting electrodes (3), characterized in that a passivation layer (7) is disposed between the photoconductor layer (6) and the common electrode (2) for impeding chemical reactions between the photoconductor layer (6) and the common electrode (2) while allowing charge carriers generated by absorption of x-rays in the photoconductor layer to pass to the common electrode (2).

2. An x-ray image sensor as claimed in claim 1, characterized in that the passivation layer is an electrically resistive layer.

3. An x-ray image sensor as claimed in claim 2, characterized in that a cladding layer (9) is disposed between the collecting electrodes (3) and the photoconductor layer (6).

4. An x-ray image sensor as claimed in claim 3, characterized in that the cladding layer is a non-stoichiometric lead-oxide layer.

5. An x-ray image sensor as claimed in claim 3, characterized in that a resistive layer (10) is provided between the cladding layer (9) and the collecting electrodes (3).

6. An x-ray image sensor as claimed in claim 1, characterized in that the passivation layer is a semiconductor layer.

7. An x-ray image sensor as claimed in claim 6, characterized in that a cladding layer (9) is disposed between the collecting electrodes (3) and the photoconductor layer (6).

8. An x-ray image sensor as claimed in claim 7, characterized in that the cladding layer is a non-stoichiometric lead-oxide layer.

9. An x-ray image sensor as claimed in claim 7, characterized in that a resistive layer (10) is provided between the cladding layer (9) and the collecting electrodes (3).

10. An x-ray image sensor as claimed in claim 1, characterized in that a bias layer (8) is provided between the common electrode and the photoconductor layer.

11. An x-ray image sensor as claimed in claim 10, characterized in that a cladding layer (9) is disposed between the collecting electrodes and the photoconductor layer (6).

12. An x-ray image sensor as claimed in claim 11, characterized in that the cladding layer is a non-stoichiometric lead-oxide layer.

13. An x-ray image sensor as claimed in claim 4, characterized in that the bias layer is a doped lead-oxide surface layer of the photoconductor layer.

14. An x-ray image sensor as claimed in claim 13, characterized in that a cladding layer (9) is disposed between the collecting electrodes (3) and the photoconductor layer (6).

15. An x-ray image sensor as claimed in claim 14, characterized in that the cladding layer is a non-stoichiometric lead-oxide layer.

16. An x-ray image sensor as claimed in claim 1, characterized in that a cladding layer (9) is disposed between the collecting electrodes (3) and the photoconductor layer (6).

17. An x-ray image sensor as claimed in claim 16, characterized in that the cladding layer is a non-stoichiometric lead-oxide layer.

18. An x-ray image sensor as claimed in claim 16, characterized in that a resistive layer (10) is provided between the cladding layer (9) and the collecting electrodes (3).

19. An x-ray image sensor as claimed in claim 1, characterized in that the composition of the lead-oxide photoconductor layer is substantially stoichiometric.

20. An x-ray examination apparatus (11) comprising an x-ray source for emitting an x-ray beam to irradiate an object for forming an x-ray image, an x-ray detector (12) to derive an electronic image signal from the x-ray image, said x-ray detector comprising an x-ray image sensor (1) including a common electrode (2), a plurality of x-ray sensitive sensor elements each comprising a collecting electrode (3), and a photoconductor layer (6) containing lead-oxide ($PbO_x$) being disposed between the common electrode (2) and the collecting electrodes (3), characterized in that a passivation layer (7) is disposed between the photoconductor layer (6) and the common electrode (2) for impeding chemical reactions between the photoconductor layer (6) and the common electrode (2) while allowing charge carriers generated by absorption of x-rays in the photoconductor layer to pass to the common electrode (2).

* * * * *